(12) United States Patent
Gattis

(10) Patent No.: US 10,291,018 B2
(45) Date of Patent: *May 14, 2019

(54) MODULAR, EXCHANGEABLE SURGE PROTECTION SYSTEM

(71) Applicant: DIVERSIFIED TECHNOLOGY GROUP, INC., Largo, FL (US)

(72) Inventor: Michael David Gattis, Seminole, FL (US)

(73) Assignee: Diversified Technology Group, Inc., Largo, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/843,756

(22) Filed: Dec. 15, 2017

(65) Prior Publication Data
US 2018/0254629 A1 Sep. 6, 2018

Related U.S. Application Data

(63) Continuation-in-part of application No. 15/477,744, filed on Apr. 3, 2017, now Pat. No. 9,875,830.

(60) Provisional application No. 62/466,688, filed on Mar. 3, 2017.

(51) Int. Cl.
*H02H 1/00* (2006.01)
*H02H 9/04* (2006.01)

(52) U.S. Cl.
CPC ..................... *H02H 9/04* (2013.01)

(58) Field of Classification Search
USPC ....................................... 361/126
See application file for complete search history.

(56) References Cited

U.S. PATENT DOCUMENTS

| | | |
|---|---|---|
| 4,913,663 A | 4/1990 | Siemon |
| 5,627,720 A | 5/1997 | Lewis |
| 5,757,603 A | 5/1998 | Kapp |
| 6,430,019 B1 | 8/2002 | Martenson |
| 8,284,536 B2 | 10/2012 | Minarczyk |
| 8,780,521 B2 | 7/2014 | Xu |
| 8,937,441 B1 | 1/2015 | Taylor |
| 9,355,763 B2 | 5/2016 | Xu |
| 9,583,296 B2 | 2/2017 | Satou |
| 9,875,830 B1 * | 1/2018 | Gattis ................. H02H 3/08 |
| 2003/0086228 A1 | 5/2003 | Papallo, Jr. |
| 2008/0030931 A1 | 2/2008 | Kozak |
| 2010/0127625 A1 | 5/2010 | Minarczyk |
| 2011/0013330 A1 | 1/2011 | Crevenat |
| 2012/0161973 A1 | 6/2012 | Hsu |
| 2012/0206848 A1 | 8/2012 | Gillespie |

* cited by examiner

*Primary Examiner* — Ronald W Leja
(74) *Attorney, Agent, or Firm* — Larson & Larson, P.A.; Frank Liebenow; Justin P. Miller

(57) ABSTRACT

A surge protection system provides surge protection to a load. The load is connected to a breaker panel through the surge protection system and a surge protection module bridges the hot/neutral/ground such that the surge protection module absorbs surges from the breaker panel and beyond. Being that, after exposure to certain amounts of surges, the surge protection modules lose effectiveness for surge protection, the surge protection module is removable and replaceable by a user without risk of personal injury from shock caused by making personal contact with electrical power. During removal and replacement, the load remains in electrical connection to the breaker panel.

20 Claims, 10 Drawing Sheets

MODULAR, EXCHANGEABLE SURGE PROTECTION SYSTEM

CROSS-REFERENCE TO RELATED APPLICATION

This application is a continuation-in-part of U.S. patent application Ser. No. 15/477,744 filed on Apr. 3, 2017 which, in turn, claims the benefit of U.S. provisional application No. 62/466,688 filed on Mar. 3, 2017, the disclosure of which is incorporated by reference.

FIELD

This invention relates to the field of electrical surge protection and more particularly to a system for providing surge protection to one or more circuits in a modular fashion.

BACKGROUND

There are many situations in which surge protection is desired to protect equipment from electrical surges caused by nature or power-line fluctuations. Electronic surge protection components known in the industry include, for example, metal-oxide varistors, arc gaps, gas discharge tubes, etc.

As the known electronic surge protection components are exposed to power-line surges, the electronic surge protection components absorb much of the energy of the surge, limiting the amount of surge energy getting to other equipment on the power line(s). Each time the electronic surge protection components absorb such energy, the life of such electronic surge protection components decreases, until, eventually there is little surge protection capability remaining, at which time, the power-line circuit that was protected by that surge protection components is no longer protected.

Often, several surge protectors are deployed to protect individual circuits of an electrical wiring system. Take for example, a gas station arrangement having a car wash, lighting, several dispensing bays, car vacuum systems, an air compressor, inside-store register systems, inside lighting, refrigeration, etc. It is important to have each individual circuit of such an arrangement individually protected so if the power grid experiences a surge, the surge from the power grid is mitigated before reaching the devices on each protected circuit and so that if one of the devices (e.g., the outdoor lighting) on the protected circuit experiences a surge, the surge is mitigated before reaching devices on other circuits.

In the past, surge protection systems offered multiple circuit protection, but as discussed above, as surges occur in one or several circuits, the entire surge protection system need be replaced or repaired, requiring removal by an experienced electrician. During the time when such surge protection systems are being repaired/replaced, each circuit protected by such surge protection systems go without power until the surge protection system is replaced, which is not desired as many such applications require 24-hour operation and shutting down several circuits to replace a multi-circuit surge protection system often requires closing the entire operation (e.g., lack of lighting is not acceptable for safety reasons, etc.).

What is needed is a system that will provide for individual replacement of surge protection for individual circuits without the need of an electrician.

SUMMARY

A surge protection system provides surge protection to one or more circuits. Each circuit is connected to power and a surge protection module bridges the circuit such that the surge protection module absorbs surges from the power and/or the circuit. Being that, after exposure to certain amounts of surges, the surge protection modules lose effectiveness for surge protection, each surge protection module is independently removable and replaceable by a user without risk of personal injury from shock caused by making personal contact with the power and/or circuit. In some embodiments, a filter circuit is provided to filter out noise on the circuit. It is anticipated that the protection module includes one or more indicators to inform a user that the protection circuit is operational and whether protection has been lost. Further, in some embodiments, a fuse is provided to protect the circuit from over current.

In one embodiment, a surge protection system for inserting between power from a breaker panel and a single load includes a main board having a first connector for connecting to input power from the breaker panel, a second connector for connecting to the single load, an electrical connection between the first connector and the second connector, and a protection module safety connector bridging the electrical connection, the protection module safety connector having recessed contacts. The recessed contacts providing protection from electric shock. A surge protection module removably connected to the protection module safety connector. The surge protection module has at least one component connected to the electrical connection through the protection module safety connector. Power from the breaker panel and power to the single load is not exposed for human touch. The first connector remains electrically connected to the second connector when the surge protection module is removed, thereby providing power from the breaker panel to the single load even after the surge protection module is removed.

In another embodiment, a surge protection system interfaced between a breaker panel and a single load includes a main board having a first connector for connecting to input power from the breaker panel, a second connector for connecting to the single load that is to be protected, an electrical connection between the first connector and the second connector, and a protection module safety connector bridging the electrical connection. The protection module safety connector having recessed contacts for protection from electric shock. A surge protection module is connected to the protection module safety connector. The surge protection module has a first metal oxide varistor connected between a line potential of the electrical connection and a neutral potential of the electrical connection and a second metal oxide varistor connected between a line potential of the electrical connection and earth ground potential of the electrical connection. The input power or power to the circuit is not exposed for human touch. The single load remains electrically connected to the breaker panel when the surge protection module is removed, thereby providing power from the breaker panel to the single load even after the surge protection module is removed.

In another embodiment, a method of protecting a single load includes connecting the single load to a first connector of a surge protection system and connecting a second connector of the surge protection system to a breaker panel. The surge protection system electrically connects a hot conductor, a neutral conductor, and a ground conductor from the single load to the breaker panel. A surge protection module is connected/plugged into a protection module safety connector of the surge protection system; thereby the surge protection module bridging the hot conductor, the neutral conductor, and the ground conductor. Removal of the surge protection module from the protection module safety connector does not interrupt power delivery from the breaker panel to the single load.

BRIEF DESCRIPTION OF THE DRAWINGS

The invention can be best understood by those having ordinary skill in the art by reference to the following detailed description when considered in conjunction with the accompanying drawings in which.

DETAILED DESCRIPTION

Figure 1:
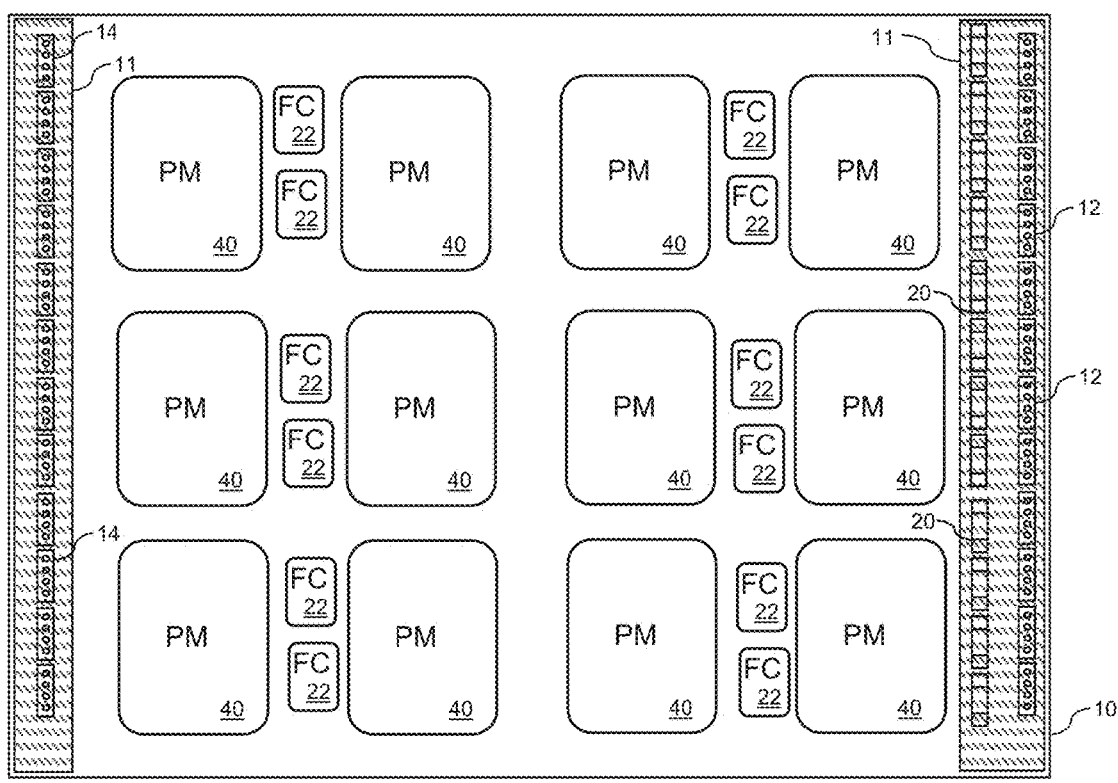
FIG. 1 illustrates a plan view of a surge protection system of the present invention.

Reference will now be made in detail to the presently preferred embodiments of the invention, examples of which are illustrated in the accompanying drawings. Throughout the following detailed description, the same reference numerals refer to the same elements in all figures.

Throughout this description, the term circuit is used to describe a power-distribution circuit to one or more devices. For example, in the United States, this is typically a 120 VAC or 240 VAC, 60 Hz circuit, but there is no limitation on the voltage, AC or DC, frequency, etc., as other countries and/or applications operate on different voltages and frequencies.

Throughout this description, the term "electrician" is used to describe a technician that is trained and/or licensed to work around live electrical circuits. For example, a gas-station owner is not typically an "electrician," and, therefore, would not be qualified to take on the task of replacing a surge protection device of prior, as there is often danger in disconnecting and reconnecting of the live wires of the circuit, etc.

Throughout this description, for example purposes, a twelve-circuit protection system is described, though it is fully anticipated that any number of circuits be protected from one circuit to many circuits, as needed and practical.

Referring to FIG. 1, a plan view of a surge protection system 8 of the present invention is shown. The surge protection system 8 includes one or more surge protection modules 40 that are replaceable, each containing the active surge protection components for protecting a circuit from surges. The surge protection system 8 has a series of connection blocks 12/14 for connecting to power (e.g. power from the main line) and for connecting to each circuit. The connection blocks 12/14 are wired such that the surge protection system 8 is easily installed with exchangeability between power inputs on one side and circuit connections on the other and vice versa. In this, as shown in detail in FIGS. 2 and 3, there is a neutral connection 12N/14N, a ground connection 12G/14G, a first hot connection 12H1/14H1, and a second hot connection 12H2.14H2 on each connection block 12/14. In this way, the power line in is connected to the first hot connection 12H1/14H1 and the power to the circuit is connected to the second hot connection 12H2/14H2, providing an easy way to configure the surge protection system 8 with inputs/outputs on either side, as desired.

As with most protection devices, a fuse 20 is provided in each circuit to limit current to the circuit being protected. It is fully anticipated that in some embodiments, no fuse 20 is present, though it is highly desired to have fuses 20.

Also, optional filter circuits 22 are provided to filter out noise on each circuit. Note that, although the filter circuits 22 are anticipated to be located on the main board 10 or within the surge protection modules 40, it is anticipated that the filter circuits 22 be on the main board 10, since the filter circuits 22 do not degrade as surges occur.

As discussed above, it is a goal to provide replaceability of surge protection modules 40 that have failed without the need of excessive down-time, and without the need of an electrician. To this, the surge protection system 8 is housed within, for example, an enclosure 6 (see FIG. 4) and all high-voltage points (e.g. fuses 20 and connection blocks 12/14 are covered/insulated from exposure by an insulating material 11 so that whoever changes the surge protection modules 40 has little chance of electrocution. Further, as will be shown in FIGS. 5 and 6, the protection module safety connector 25 for connecting the surge protection modules 40 to the main board 10 has recessed conductors 26N/26H/30G/32S to shield the user from dangerous voltages. Therefore, removal of the surge protection module 40 does not interrupt power provided to the protected circuit.

Figure 2:
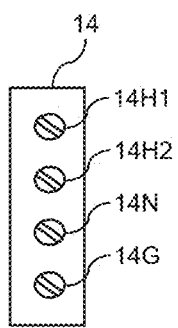
FIG. 2 illustrates a plan view of a connection block of the surge protection system.
Figure 3:
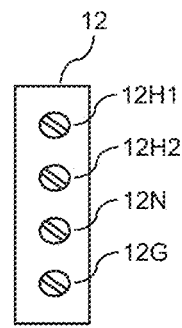
FIG. 3 illustrates a plan view of a second connection block of the surge protection system.

Referring to FIGS. 2 and 3, detailed plan views of connection blocks 12/14 of the surge protection system 8 is shown. The connection blocks 12/14 are wired such that the surge protection system 8 is easily installed with exchangeability between power input connected to the first connection block 12 and output circuits connected to the second connection block 14 or, alternatively, power input connected to the second connection block 14 and output circuits connected to the first connection block 12. In this, there is a neutral connection 12N/14N, a ground connection 12G/14G, a first hot connection 12H1/14H1, and a second hot connection 12H2.14H2 on each connection block 12/14. In this way, the power line in is connected to the first hot connection 12H1/14H1 and the power to the circuit is connected to the second hot connection 12H2/14H2, providing an easy way to configure the surge protection system 8 with inputs/outputs on either side, as desired.

Figure 4:
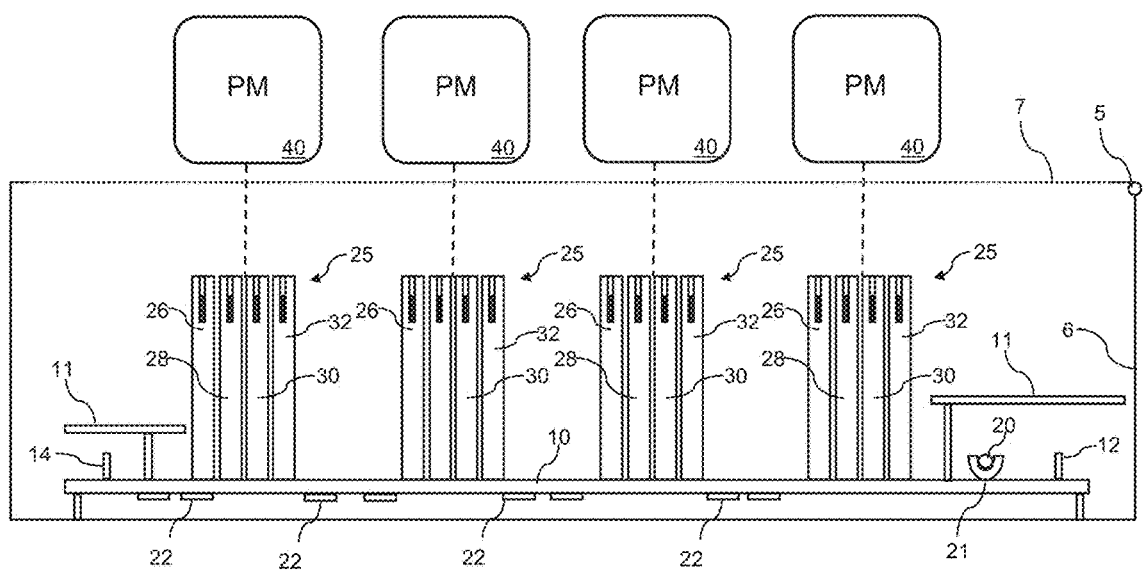
FIG. 4 illustrates a cut-away elevation view of the surge protection system.

Referring to FIG. 4, a cut-away elevation view of the surge protection system 8 is shown. Although any suitable enclosure is anticipated, in this example, the main board 10 is held within an enclosure 6 (typically a metal enclosure) that has a cover 7 that is attached to the enclosure 6, for example by a hinge 5. Note that the cover 7 is made of any material, though a translucent or transparent material is anticipated to provide a quick view of the indicators 42/44/46/48 of the surge protection modules 40 for quick identification of which surge protection module 40 that has failed. In FIG. 4, the filter circuits 22 are shown mounted to the main board 10 and the fuses 20 sit in fuse clips 21 for quick replacement (e.g., by an electrician).

Figure 5:
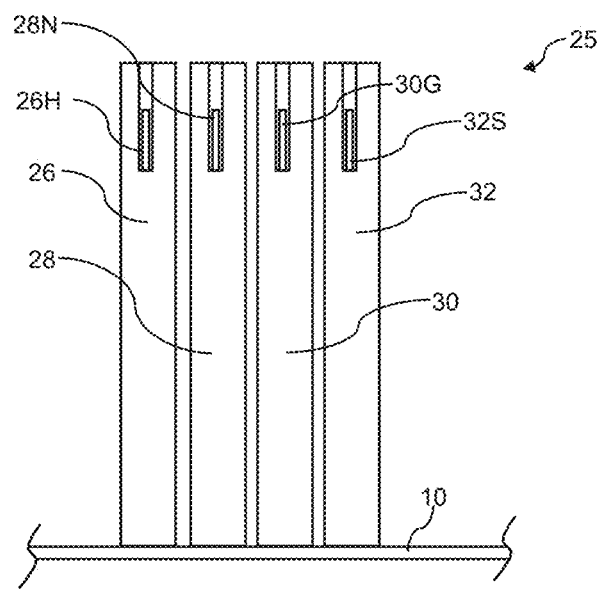
FIG. 5 illustrates an elevation view of a protection module safety connector of the surge protection system.

The surge protection modules 40 have internal connectors that receive the respective protection module safety connectors 25, one of which is shown in detail in FIG. 5. Each protection module safety connector 25 is shown having a leg for a hot connection 26, a leg for a neutral connection 28, a leg for a ground connection 30, and a leg for a signaling connection 32 (e.g. to signal status to a remote location). The number of conductors within the protection module safety connector 25 in this example is four, though in other embodiments, two, three, or more conductors is anticipated.

Referring to FIG. 5, an elevation view of a protection module safety connector 25 of the surge protection system 8 is shown. Each protection module safety connector 25 is shown having a leg for a hot connection 26, a leg for a neutral connection 28, a leg for a ground connection 30, and a leg for a signaling connection 32 (e.g. to signal status to a remote location). The number of conductors 26H/28N/30G/32S within the protection module safety connector 25 in this example is four, though in other embodiments, two, three, or more conductors is anticipated. Note that each of the conductors 26H/28N/30G/32S are recessed within the respective leg (leg for a hot connection 26, a leg for a neutral connection 28, a leg for a ground connection 30, and a leg for a signaling connection 32) to protect from inadvertent contact by a user replacing a surge protection module 40 with potentially dangerous power levels. This recessed contact operates in a similar fashion to standard power outlets in one's home.

Figure 6:
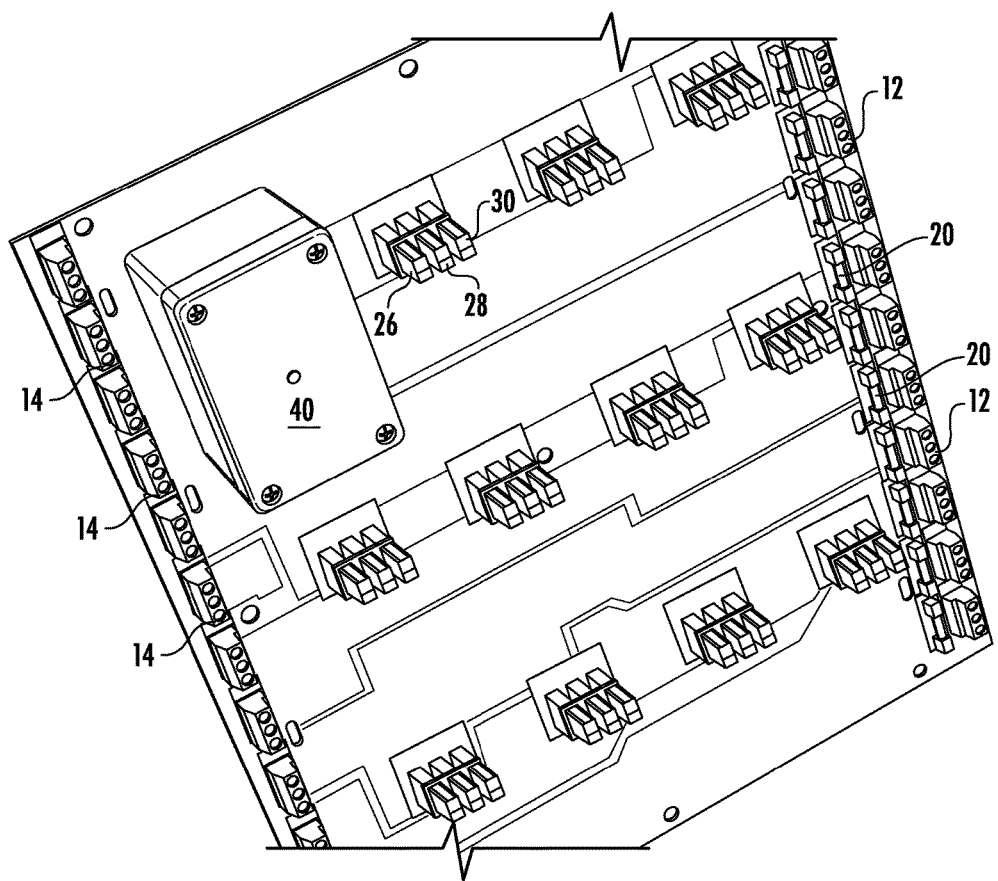
FIG. 6 illustrates a perspective view of the surge protection system with a single surge protection module installed.

Referring to FIG. 6, a perspective view of the surge protection system 8 with a single surge protection module 40 installed is shown. The main board 10 is shown out of the enclosure 6 and the single surge protection module 40 is installed onto the protection module safety connector 25. Also visible are the connection blocks 12/14 and the fuses 20.

Figure 7:
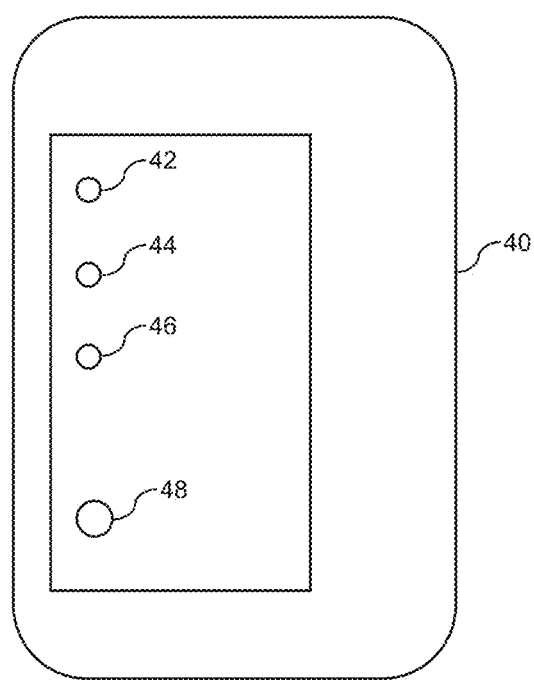
FIG. 7 illustrates a plan view of a panel of one of the surge protection modules.

Referring to FIG. 7, a plan view of an indicator panel of one of the surge protection modules 40 is shown. So that the user (e.g. shop keeper, station owner, etc.) knows that each circuit is protected and the status of each surge protection module 40, one or more indicators 42/44/46/48 are provided on the face of each surge protection module 40.

After a surge protection system 8 is exposed to one or more surges, it is anticipated that one or more of the surge protection modules 40 weaken or fail. Such weakening or failure is detected by circuitry within each surge protection module 40 and indicated on the one or more indicators 42/44/46/48 and/or communicated electronically to a remote system through the signal connection 32S. By making the surge protection modules 40 replaceable by those other than an electrician, a user (for example, a shop owner, gas station manager, etc.) seeing an indicator 42/44/46/48 that indicates loss of surge protection is able to remove a surge protection module 40 that has failed and replace that surge protection module 40 with a new surge protection module 40. In this way, the user is able to order spare surge protection modules 40 or, upon detecting a failure, the user is able to order a new surge protection module 40 from the manufacturer (e.g., for overnight shipping, etc.).

Figure 8:
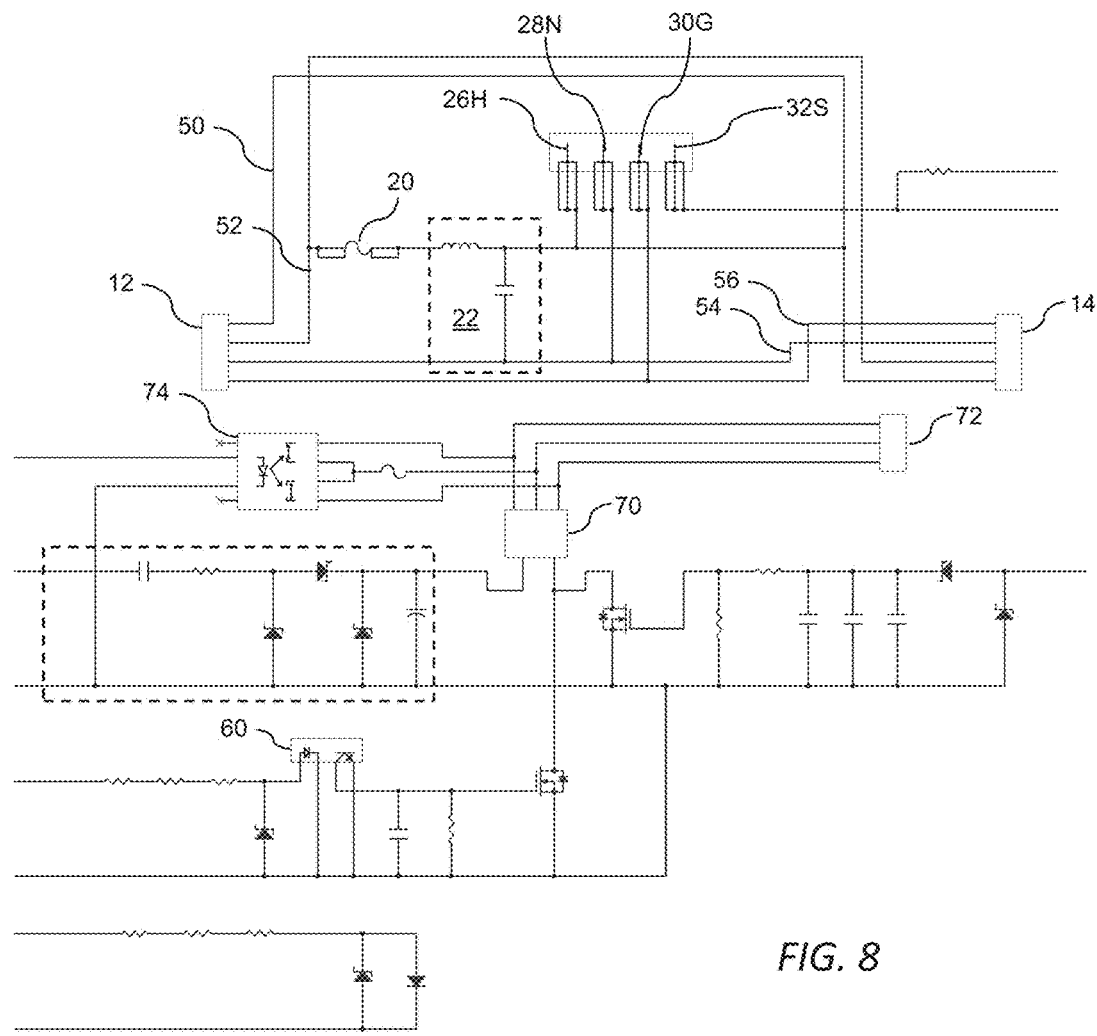
FIG. 8 illustrates a schematic diagram of the main circuit board of the surge protection system.

Referring to FIG. 8, a schematic diagram of the main board 10 of the surge protection system 8 is shown. In the exemplary wiring scheme shown, each connection block 12/14 has two hot connections, hot-1 50 and hot-2 52. For example, the input power hot is connected to hot-2 52 on either connection block 12/14 and the output power hot is connected to the hot-1 50 on the other connection block 12/14, allowing for interchangeable wiring from either side of the main board 10. The neutral 54 and ground 56 are connected to respective neutral and ground connections of each connection block 12/14. The fuse 20 protects the filter circuit 22 and the surge protection module 40 (not shown in FIG. 8), and the protected circuit from excessive current. I some embodiments, optic reflector sensors 74 are used to detect the presence of each surge protection module 40 and interface to a dry-contact signaling system 72 (as known in the industry) for reporting missing/failed surge protection modules 40 to a remote site.

Figure 9:
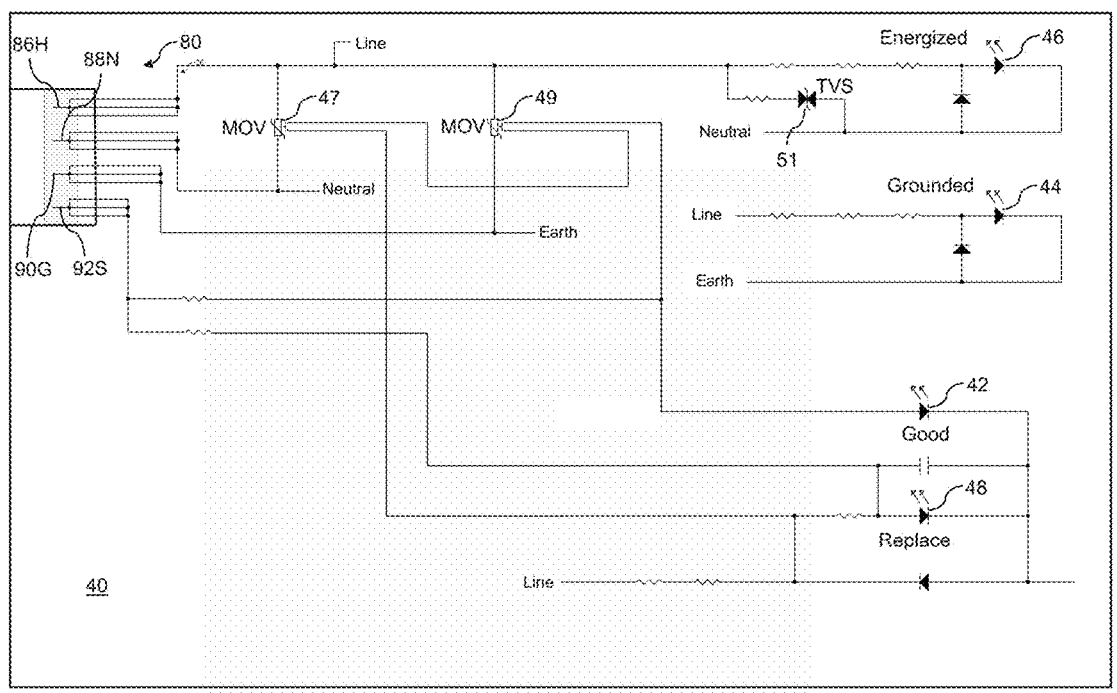
FIG. 9 illustrates a schematic diagram of the surge protection module of the surge protection system.

Referring to FIG. 9, a schematic diagram of the surge protection module 40 of the surge protection system 8 is shown. The surge protection module 40 has a connector 80 that mates with one of the protection module safety connectors 25. The connector has a first contact 86H for mating with the first recessed connector 26H of the main board for connecting to the line (or "hot") of the circuit that is being protected from surges. The connector has a second contact 88N for mating with the second recessed connector 28N of the main board for connecting to the neutral of the circuit that is being protected from surges. The connector has a third contact 90G for mating with the third recessed connector 30G of the main board for connecting to the ground of the circuit that is being protected from surges. In some embodiments, the connector has a fourth contact 92S for mating with the fourth recessed connector 32S of the main board for relaying signaling information to a remote location.

Although many configurations, layouts, and implementations of a surge protection module 40 are anticipated, the exemplary schematic shown in FIG. 9 includes two metal-oxide varistors (MOVS) 47/49 with a first metal-oxide varistors (MOVS) 47 bridging the line and neutral and a second metal-oxide varistors (MOVS) 49 bridging the line and ground (e.g. earth ground). Again, this is an example, and other embodiments are fully anticipated, for example, a single metal-oxide varistors (MOVS) 47 bridging the line and neutral, etc.

In this embodiment, a transient voltage suppression diode 51 also bridges the line and neutral, providing added protection from transient voltage spikes.

As the metal-oxide varistors (MOVS) 47/49 absorb energy from circuit surges, the metal-oxide varistors (MOVS) 47/49 weaken and, eventually, fail in an open mode—e.g. they no longer function to absorb substantial amounts of energy of a circuit surge. In some embodiments, the metal-oxide varistors (MOVS) 47/49 include signaling outputs that drive two indicators 42/48. The "Replace" indicator 48 illuminates when the metal-oxide varistors (MOVS) 47/49 indicate they can no longer absorb energy from surges while the "Good" indicator 42 illuminates when the metal-oxide varistors (MOVS) 47/49 indicate they are in good condition.

In some embodiments, a "Grounded" indicator 44 illuminates when proper grounding to earth is present and, in some embodiments, an "Energize" indicator 44 illuminates when power is present in the protected circuit.

Figure 10:
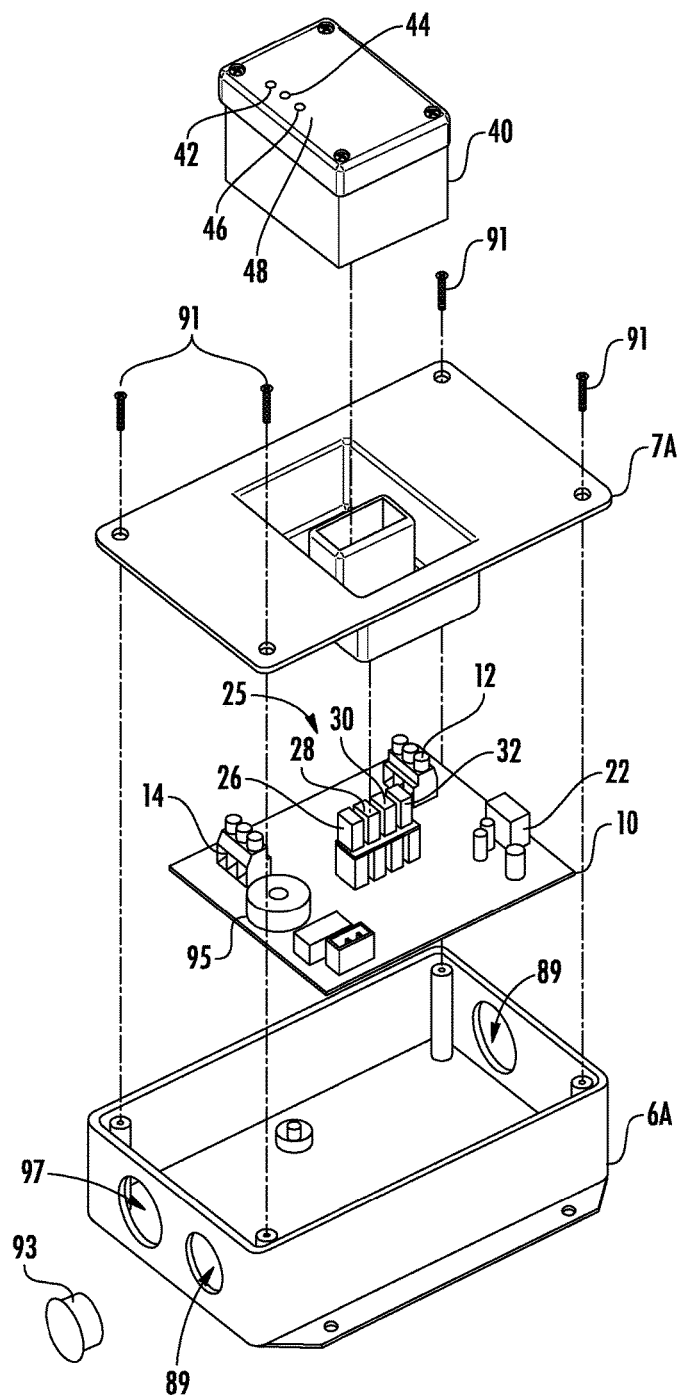
FIG. 10 illustrates a perspective view of the surge protection system with a single surge protection module.

Referring to FIG. 10, a perspective view of the surge protection system with a single surge protection module 40 is shown. In this exemplary embodiment, an enclosure 6A/7A is formed having a single safety connector 25 for accepting a single surge protection module 40. The enclosure 6A/7A is a wall-mountable enclosure, preferably made from acrylonitrile-butadiene-styrene (ABS). The surge protection system with a single surge protection module 40 is designed to protect, for example, fire alarm panels while providing audible and remote notification when the surge protection module 40 is removed or has expired. Prior protection devices require a separate enclosure for UL approval.

The enclosure 6A/7A includes mounting holes for conduit adapters, a sound port 97 for the audible alarm 95, and a single safety connector 25 for accepting a single surge protection module 40 for self-servicing with replacement surge protection modules 40.

The one or more indicators 42/44/46/48 of the surge protection module 40 are easily viewed from across the room.

One or more conduit openings 89 are provided for electrical connections, one of which is filled with a plug 93 for safety reasons. The cover 7A holds the surge protection module 40 and blocks exposure to high voltage wires within the box 6A, allowing for user exchange of the surge protection modules 40. In some embodiments, the cover 7A is affixed to the box 6A by a plurality of screws 91.

In some embodiments, when the surge protection module 40 is removed from the safety connector 25, alarm information is transmitted to a remote location as described above. Further, in some embodiments, the audible alarm 95 (e.g. piezo transducer, sounder) is operated when the surge protection module 40 fails or when the surge protection module 40 is removed. In some such embodiments, the audible alarm 95 is delayed for a period of time such as one hour to enable a user to exchange surge protection modules 40 or recognize a failed surge protection module 40 through the one or more indicators 42/44/46/48 before being interrupted by the sound generation.

Figure 11:
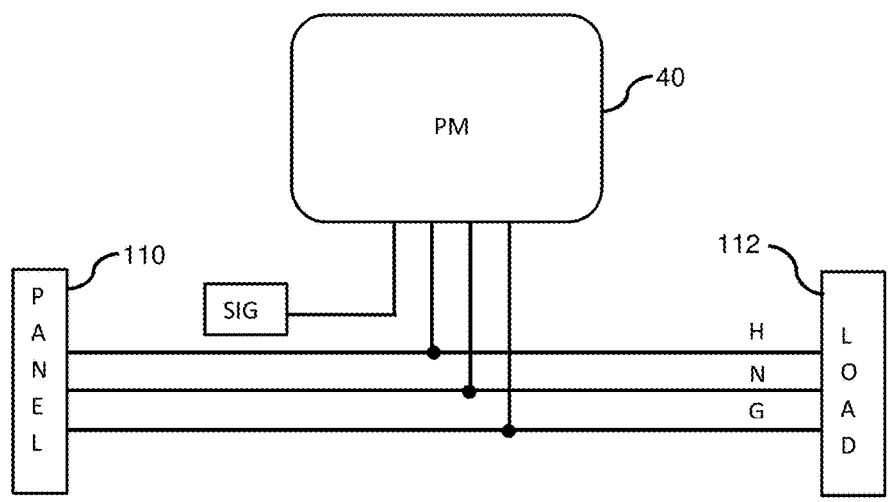
FIG. 11 illustrates a schematic view of the surge protection system with a single surge protection module.

Referring to FIG. 11, a schematic view of the surge protection system with a single surge protection module 40 is shown. The surge protection system with a single surge protection module 40 is designed to protect, for example, fire alarm panels while providing audible and remote notification when the surge protection module 40 is removed or has expired. In FIG. 11, it is clearly shown that the power from the source (e.g. breaker panel 110) is directly connected to the load 112 (e.g. a fire alarm panel) so that, removal and replacement of the surge protection module 40 does not interrupt power to the load 112 which, in itself, has the possibility of causing failure of the load 112 or, at the least, disruption of functionality of the load 112. The hot (H), neutral (N), and ground (G) is connected directly from the source (e.g. breaker panel 110) to the load 112, with the surge protection module 40 bridging the hot (H), neutral (N), and ground (G). In this way, removal of the surge protection module 40 does not disrupt power distribution.

Equivalent elements can be substituted for the ones set forth above such that they perform in substantially the same manner in substantially the same way for achieving substantially the same result.

It is believed that the system and method as described and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely exemplary and explanatory embodiment thereof. It is the intention of the following claims to encompass and include such changes.

What is claimed is:

1. A surge protection system for inserting between power from a breaker panel and a single load, the surge protection system comprising:

a main board having a first connector for connecting to input power from the breaker panel, a second connector for connecting to the single load, an electrical connection between the first connector and the second connector, and a protection module safety connector bridging the electrical connection, the protection module safety connector having recessed contacts, the recessed contacts providing protection from electric shock; and a surge protection module removably connected to the protection module safety connector, the surge protection module having at least one component connected to the electrical connection through the protection module safety connector;

whereas the power from the breaker panel and power to the single load is not exposed for human touch; and whereas the first connector remains electrically connected to the second connector when the surge protection module is removed, thereby providing power from the breaker panel to the single load even after the surge protection module is removed.

2. The surge protection system of claim 1, wherein the electrical connection comprises a hot connection, neutral connection, and ground connection.

3. The surge protection system of claim 1, further comprising an audible alarm interfaced to the surge protection module, the audible alarm emitting a noise upon removal of the surge protection module or upon failure of the surge protection module.

4. The surge protection system of claim 1, further comprising a filter circuit interfaced to the electrical connection.

5. The surge protection system of claim 1, further comprising at least one indicator on the surge protection module.

6. The surge protection system of claim 5, wherein a first indicator of the at least one indicator on the surge protection module indicates loss of surge protection.

7. The surge protection system of claim 1, wherein the protection module safety connector provides a first electrical conductor to a neutral potential of the electrical connection, a second electrical conductor to a line potential of the electrical connection, and a third electrical conductor to an earth ground potential of the electrical connection.

8. The surge protection system of claim 7, wherein the surge protection module comprises at least one protection device bridging at least two of the first electrical conductor, the second electrical conductor, and the third electrical conductor.

9. The surge protection system of claim 8, wherein the at least one protection device comprises a first metal oxide varistor connected between the second electrical conductor and the first electrical conductor and a second metal oxide varistor connected between the second electrical conductor and the third electrical conductor.

10. A surge protection system for inserting between power from a breaker panel and a single load, the surge protection system comprising:

a main board having a first connector for connecting to input power from the breaker panel, a second connector for connecting to the single load that is to be protected, an electrical connection between the first connector and the second connector, and a protection module safety connector bridging the electrical connection, the protection module safety connector having recessed contacts, the recessed contacts providing protection from electric shock; and a surge protection module connected to the protection module safety connector, the surge protection module comprising a first metal oxide varistor connected between a line potential of the electrical connection and a neutral potential of the electrical connection and a second metal oxide varistor connected between a line potential of the electrical connection and earth ground potential of the electrical connection;

whereas the input power or power to the circuit is not exposed for human touch; and whereas the single load remains electrically connected to the breaker panel when the surge protection module is removed, thereby providing power from the breaker panel to the single load even after the surge protection module is removed.

11. The surge protection system of claim 10, further comprising an audible alarm interfaced to the surge protection module, the audible alarm emitting a noise upon removal of the surge protection module or upon failure of the surge protection module.

12. The surge protection system of claim 10, further comprising a filter circuit interfaced to the electrical connection.

13. The surge protection system of claim 10, further comprising at least one indicator on the surge protection module.

14. The surge protection system of claim 13, wherein a first indicator of the at least one indicator on the surge protection module indicates loss of surge protection.

15. The surge protection system of claim 10, wherein the protection module safety connector provides a first electrical conductor to the neutral potential of the electrical connection, a second electrical conductor to the line potential of the electrical connection, and a third electrical conductor to the earth ground potential of the electrical connection.

16. The surge protection system of claim 15, wherein the protection module safety connector provides a fourth electrical conductor for signaling a status of the surge protection module.

17. A method of protecting a single load, the method comprising:

connecting the single load to a first connector of a surge protection system;

connecting a second connector of the surge protection system to a breaker panel, the surge protection system electrically connecting a hot conductor, a neutral conductor, and a ground conductor from the single load to the breaker panel; and connecting a surge protection module to a protection module safety connector of the surge protection system, the surge protection module thereby bridging the hot conductor, the neutral conductor, and the ground conductor;

whereas removing of the surge protection module from the protection module safety connector does not interrupt power delivery from the breaker panel to the single load.

18. The method of claim 17, further comprising:

after an indication from the surge protection module that the surge protection module has failed, removing the surge protection module from the protection module safety connector and connecting a new surge protection module to the protection module safety connector.

19. The method of claim 18, wherein between the steps of removing the surge protection module and connecting the new surge protection module, the single load remains electrically connected to the breaker panel.

20. The method of claim 17, further comprising:

emitting noise from an audible alarm that is interfaced to the surge protection module through the protection module safety connector after failing of the surge protection module.

* * * * *